US010090226B2

(12) United States Patent
Chainer et al.

(10) Patent No.: US 10,090,226 B2
(45) Date of Patent: Oct. 2, 2018

(54) DISTRIBUTION AND STABILIZATION OF FLUID FLOW FOR INTERLAYER CHIP COOLING

(71) Applicant: International Business Machines Corporation, Armonk, NY (US)

(72) Inventors: Timothy J. Chainer, Putnam Valley, NY (US); Pritish R. Parida, Stamford, CT (US); Fanghao Yang, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/798,521

(22) Filed: Oct. 31, 2017

(65) Prior Publication Data

US 2018/0061738 A1 Mar. 1, 2018

Related U.S. Application Data

(63) Continuation of application No. 14/976,135, filed on Dec. 21, 2015, now Pat. No. 9,847,275.

(51) Int. Cl.
*H01L 23/34* (2006.01)
*H01L 23/473* (2006.01)
(Continued)

(52) U.S. Cl.
CPC ........ *H01L 23/473* (2013.01); *H01L 21/4882* (2013.01); *H01L 23/02* (2013.01); *H01L 23/3675* (2013.01); *H01L 23/427* (2013.01)

(58) Field of Classification Search
CPC ..... H01L 23/473; H01L 23/02; H01L 23/427; H01L 23/3675; H01L 21/4882
See application file for complete search history.

(56) References Cited

U.S. PATENT DOCUMENTS

| 5,138,765 | A | 8/1992 | Watson et al. |
| 5,568,835 | A | 10/1996 | LaCount et al. |

(Continued)

FOREIGN PATENT DOCUMENTS

| JP | 06132623 A | 5/1994 |
| KR | 100713930 B1 | 4/2007 |
| WO | 2011060186 A2 | 5/2011 |

OTHER PUBLICATIONS

Kandlikar, "Review and Projections of Integrated Cooling Systems for Three-Dimensional Integrated Circuits", Journal of Electronic Packaging, Jun. 2014, vol. 136, pp. 024001-1-024001-11.

(Continued)

*Primary Examiner* — Victor A Mandala
(74) *Attorney, Agent, or Firm* — L. Jeffrey Kelly

(57) ABSTRACT

A method of forming metallic pillars between a fluid inlet and outlet for two-phase fluid cooling. The method may include; forming an arrangement of metallic pillars between two structures, the metallic pillars are electrically connected to metallic connecting lines that run through each of the two structures, the arrangement of metallic pillars located between a fluid inlet and a fluid channel, the fluid channel having channel walls running between arrangements of the metallic pillars and a fluid outlet, whereby a fluid passes through the arrangement of metallic pillars to flow into the fluid channel.

4 Claims, 11 Drawing Sheets

(51) Int. Cl.
*H01L 23/427* (2006.01)
*H01L 23/02* (2006.01)
*H01L 23/367* (2006.01)
*H01L 21/48* (2006.01)

(56) References Cited

U.S. PATENT DOCUMENTS

| | | | |
|---|---|---|---|
| 7,575,046 B2 | 8/2009 | Kandlikar | |
| 7,835,151 B2 | 11/2010 | Olesen | |
| 7,990,711 B1 | 8/2011 | Andry et al. | |
| 8,110,415 B2* | 2/2012 | Knickerbocker | H01L 25/0652 257/712 |
| 8,174,826 B2 | 5/2012 | El-Essawy et al. | |
| 8,363,402 B2 | 1/2013 | Brunschwiler et al. | |
| 8,493,736 B2 | 7/2013 | Oprins et al. | |
| 8,780,552 B2 | 7/2014 | El-Essawy et al. | |
| 8,797,741 B2 | 8/2014 | Altman | |
| 8,869,830 B2 | 10/2014 | Tonkovich et al. | |
| 9,159,602 B2 | 10/2015 | Andry et al. | |
| 2005/0200001 A1 | 9/2005 | Joshi et al. | |
| 2005/0205241 A1 | 9/2005 | Goodson et al. | |
| 2008/0272484 A1* | 11/2008 | Myers | H01L 23/473 257/714 |
| 2009/0057878 A1* | 3/2009 | Gomez | H01L 23/4334 257/706 |
| 2009/0057879 A1* | 3/2009 | Garrou | H01L 23/473 257/713 |
| 2009/0057882 A1 | 3/2009 | Gerbsch | |
| 2009/0108435 A1* | 4/2009 | Bernstein | H01L 23/473 257/691 |
| 2010/0117201 A1* | 5/2010 | Ching | H01L 23/473 257/621 |
| 2010/0187682 A1 | 7/2010 | Pinjala et al. | |
| 2011/0205708 A1 | 8/2011 | Andry et al. | |
| 2011/0304987 A1 | 12/2011 | Oprins et al. | |
| 2012/0105144 A1 | 5/2012 | Barowski et al. | |
| 2012/0212907 A1 | 8/2012 | Dede | |
| 2012/0228779 A1 | 9/2012 | King, Jr. et al. | |
| 2012/0331433 A1 | 12/2012 | Brunschwiler et al. | |
| 2013/0025831 A1 | 1/2013 | Attinger et al. | |
| 2013/0044431 A1 | 2/2013 | Koeneman | |
| 2013/0092938 A1 | 4/2013 | Knickerbocker et al. | |
| 2014/0015119 A1* | 1/2014 | Bonkohara | H01L 23/473 257/713 |
| 2014/0071628 A1* | 3/2014 | Brunschwiler | H01L 23/367 361/700 |
| 2014/0307389 A1 | 10/2014 | Arvelo et al. | |
| 2015/0075755 A1 | 3/2015 | Arvelo et al. | |
| 2015/0198380 A1* | 7/2015 | Haj-Hariri | B64G 1/50 62/3.2 |
| 2016/0128232 A1* | 5/2016 | Chainer | H01L 23/3735 361/700 |
| 2016/0343626 A1* | 11/2016 | Colosimo, Jr. | B23K 20/023 |
| 2017/0179001 A1 | 6/2017 | Brunschwiler et al. | |
| 2017/0179002 A1 | 6/2017 | Chainer et al. | |

OTHER PUBLICATIONS

Kandlikar et al., "Stabilization of Flow Boiling in Microchannels Using Pressure Drop Elements and Fabricated Nucleation Sites", Journal of Heat Transfer, Apr. 2006, vol. 128, pp. 389-396.

Kosar et al., "Suppression of Boiling Flow Oscillations in Parallel Microchannels by Inlet Restrictors", Journal of Heat Transfer, Mar. 2006, vol. 128, pp. 251-260.

Romagnoli et al., "Micro-fluidic Silicon Cooling Devices for Particle Tracking Detectors", 14th IEEE ITHERM conference, 2014 IEEE, 8 pages.

IBM: List of IBM Patent or Patent Applications Treated as Related (Appendix P), Feb. 14, 2018, 2 pages.

Pending U.S. Appl. No. 15/894,974, filed Feb. 13, 2018, entitled: "Counter-Flow Expanding Channels for Enhanced Two-Phase Heat Removal", 25 pages.

IBM: List of IBM Patents or Patent Applications Treated as Related (Appendix P), Jan. 15, 2018, 2 pages.

Pending U.S. Appl. No. 15/798,527, filed Oct. 31, 2017, entitled: "Distribution and Stabilization of Fluid Flow for Interlayer Chip Cooling", 25 pages.

Pending U.S. Appl. No. 15/798,534, filed Oct. 31, 2017, entitled: "Distribution and Stabilization of Fluid Flow for Interlayer Chip Cooling", 25 pages.

* cited by examiner

US 10,090,226 B2

DISTRIBUTION AND STABILIZATION OF FLUID FLOW FOR INTERLAYER CHIP COOLING

STATEMENT REGARDING FEDERALLY SPONSORED RESEARCH OR DEVELOPMENT

This invention was made with United States Government support under DARPA Agreement No. FA8650-14-c-7466. THE GOVERNMENT HAS CERTAIN RIGHTS IN THIS INVENTION.

BACKGROUND

The present invention generally relates to two-phase cooling for integrated circuits (ICs), and more particularly to the formation of micro-metallic pillars for IC cooling, flow stabilization, and distribution.

A two-phase liquid cooling system could efficiently suppress junction temperatures with less power consumption using vaporization near high performance integrated circuits (ICs). Specifically, for 3D ICs, micro-channels shall be embedded inside stackable silicon dies to remove heat and obtain certain temperature profile.

SUMMARY

According to one embodiment of the present invention, a method of forming metallic pillars between a fluid inlet and outlet for two-phase fluid cooling is provided. The method may include providing a first semiconductor structure having first metallic attachments on a top surface of a first substrate and second metallic attachments on a bottom surface of the first substrate, the first metallic attachments connected to first connecting lines and the second metallic attachments connected to second connecting lines, wherein the first connecting lines and the second connecting lines are in the first substrate; forming first metallic pillars on the second metallic attachments; providing a second semiconductor structure having third metallic attachments on a top surface of a second substrate and fourth metallic attachments on a bottom surface of the second substrate, the third metallic attachments connected to third connecting lines and the fourth metallic attachments connected to fourth connecting lines, wherein the third connecting lines and the fourth connecting lines are in the second substrate; forming second metallic pillars on the fourth metallic attachments; forming an assembled semiconductor structure by bonding the first metallic pillars to the second metallic pillars using a conductive material, wherein a fluid channel separates the bottom surface of the first semiconductor structure from the bottom surface of the second semiconductor structure; and enclosing the assembled structure within an enclosure, wherein a fluid can enter the enclosure through an inlet port, pass between the bonded metallic pillars and through the fluid channel, and exit the enclosure through an outlet port.

According to another embodiment of the present invention, a structure for two-phase fluid cooling of integrated circuits (IC's) is provided. The structure may include an enclosure; a first semiconductor structure; a second semiconductor structure located above the first semiconductor structure, wherein the first semiconductor structure and the second semiconductor structure are within the enclosure; and an arrangement of metallic pillars located between the first semiconductor structure and the second semiconductor structure, wherein the arrangement of metallic pillars electrically and thermally connect the first semiconductor structure to the second semiconductor structure, the arrangement of metallic pillars located in a fluid channel separating the first semiconductor structure and the second semiconductor structure; wherein a fluid enters the enclosure at a fluid inlet and passes between the first semiconductor structure and the second semiconductor structure through the fluid channel and exits the enclosure at a fluid outlet, the fluid cooling the arrangement of metallic pillars through a two-phase cooling process.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
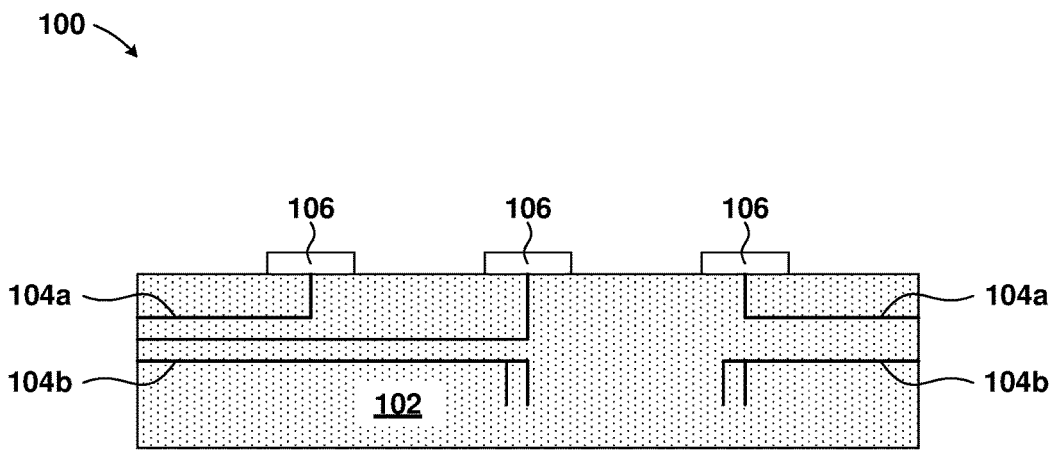
FIG. 1 is a cross sectional side view of a semiconductor structure is provided, according to an embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to two-phase cooling for integrated circuits (ICs), and more particularly to the formation of micro-metallic pillars for IC cooling, flow stabilization, and distribution. The present invention includes a fabrication, design method and arrangements of micro-metallic pillars in 3D chip stacks. The pillar arrangements facilitate, among other things, both controlling two-phase flow and distributing flow and bubble generation in micro-channels. One or more arrangements of metallic pillars can generate uniform flow velocity fields and enhance two-phase flow stability. The metallic pillars can provide electrical and thermal interconnections between semiconductor structures (e.g., chips) as well as provide structural support of chips in a 3D stack. Exemplary embodiments by which to form micro-channels and metallic pillars are described in detail below referring to the accompanying drawings FIGS. 1-13.

With reference to FIG. 1, a demonstrative illustration of a first structure 100 during an intermediate step of a method of fabricating micro-metallic pillars is provided, according to an embodiment. More specifically, the first structure 100 can include a first metallic attachment 106 on a substrate 102.

The substrate 102 may include; a bulk semiconductor substrate, a layered semiconductor substrate (e.g., Si/SiGe), a silicon-on-insulator substrate (SOI), or a SiGe-on-insulator substrate (SGOI). The substrate 102 may include any semiconductor material known in the art, such as, for example; Si, Ge, SiGe, SiC, SiGeC, Ga, GaAs, InAs, InP, or other elemental or compound semiconductors. The substrate 102 may include, for example; an n-type, p-type, or undoped semiconductor material and may have a monocrystalline, polycrystalline, or amorphous structure. In an embodiment, the substrate 102 is a bulk silicon substrate.

A first connecting line 104a and a second connecting line 104b may be formed in the substrate 102 using any line formation technique known in the art, such as, for example, a trench and fill process. The first and second connecting lines 104a, 104b may be any conductive material known in the art, such as, for example, tungsten (W). The first connecting line 104a may be exposed on a top surface of the substrate 102 and the second connecting line 104b can be buried in the substrate 102.

The first metallic attachment 106 may be formed on a top surface of the substrate 102 and may be in contact with the first connecting line 104a. The first metallic attachment 106 can be formed using any deposition technique known in the art, such as, for example, epitaxial growth, chemical vapor deposition (CVD), physical vapor deposition (PVD), or atomic layer deposition (ALD). The first metallic attachments may be deposited as an attachment layer and patterned to form the first metallic attachment 106 using any patterning technique known in the art, such as, for example, a mask and etching process. The first metallic attachment 106 can be any metallic material known in the art, such as, for example, a Sn—Pb alloy and/or BGA solder balls.

Figure 2:
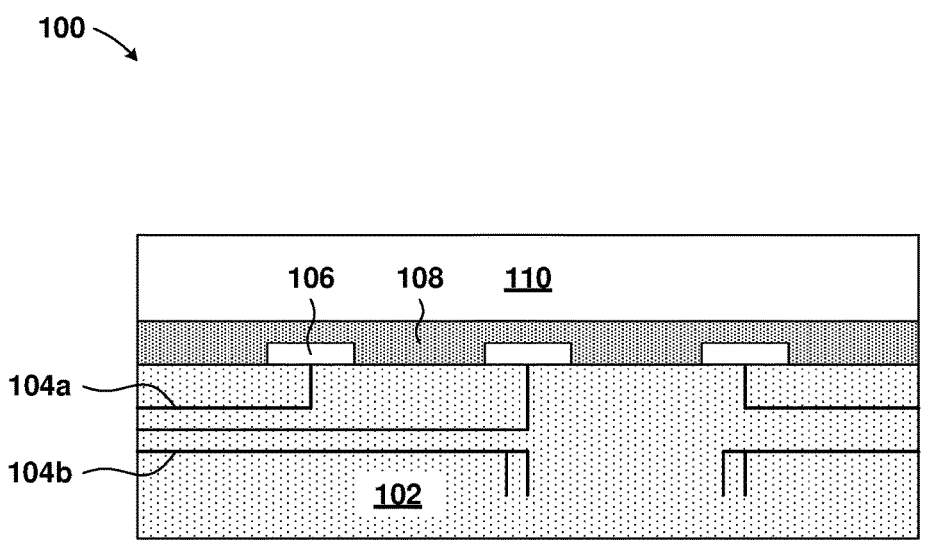
FIG. 2 is a cross sectional side view of the semiconductor structure and illustrates the bonding of a glass handler to the semiconductor structure, according to an embodiment.

With reference to FIG. 2, a demonstrative illustration of the first structure 100 during an intermediate step of a method of fabricating micro-metallic pillars is provided, according to an embodiment. More specifically, a handler substrate can be bonded to the top surface of the substrate 102 and the first metallic attachment 106 (flipped in FIG. 2 for a subsequent thinning step described further with reference to FIG. 3) using any carrier bonding technique known in the art. The handler substrate can be bonded to the top surface of the substrate 102 using a first adhesive layer 108 and a handler layer 110 as is known in the art.

Figure 3:
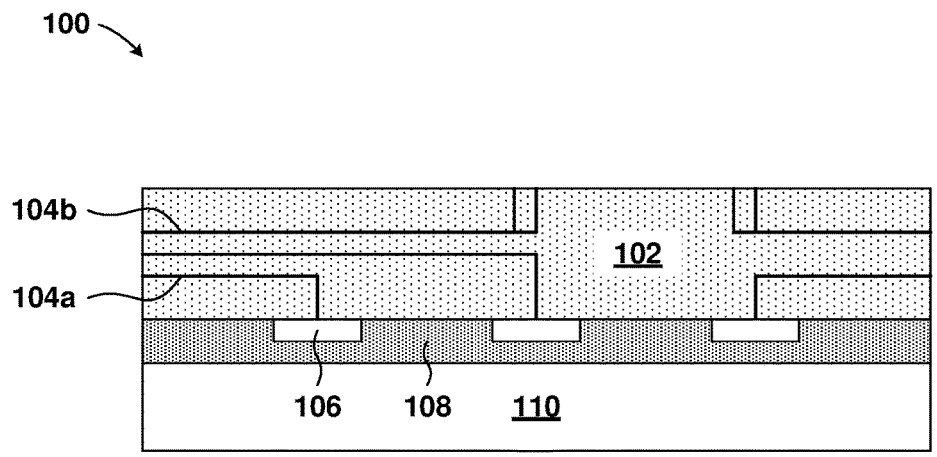
FIG. 3 is a cross sectional side view of the semiconductor structure and illustrates the thinning of a backside of the semiconductor structure, according to an embodiment.
Figure 4:
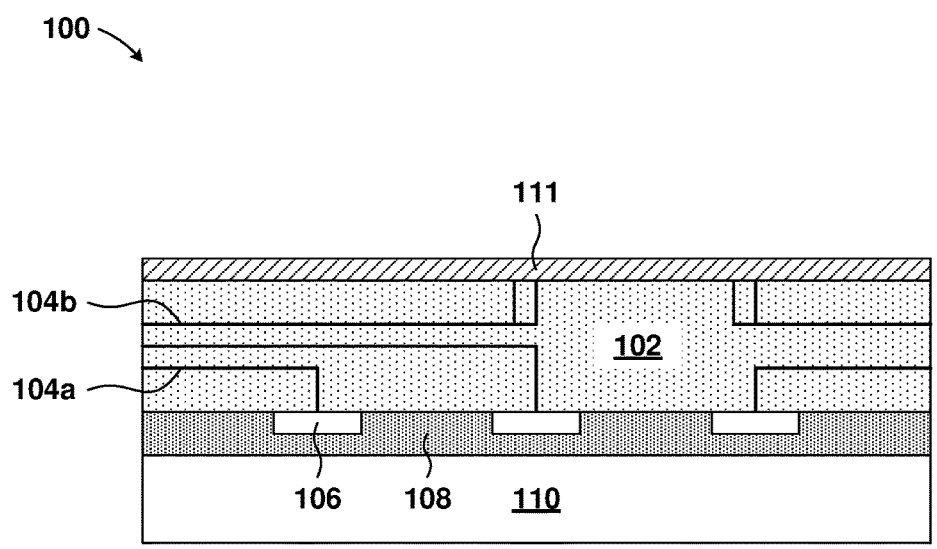
FIG. 4 is a cross sectional side view of the semiconductor structure and illustrates the formation of a metal layer on the backside of the semiconductor structure, according to an embodiment.

With reference to FIGS. 3 and 4, a demonstrative illustration of the first structure 100 during an intermediate step of a method of fabricating micro-metallic pillars is provided, according to an embodiment. More specifically, a metal layer 111 may be formed on a polished back side of the substrate.

The backside of the substrate 102 may be polished (i.e., thinned) using any polishing technique known in the art, such as, for example, a grinding and polishing process. This process may be performed using conventional grinding, polishing and/or chemical etching means. For instance, a backside grind and polish can be performed on the back surface of the substrate 102 to remove the material within 10-20 microns of the bottom connecting line 104b. A wet etch can then be performed to expose the bottom connecting line 104b on a thinned bottom surface of the substrate 102.

The metal layer 111 may be formed using any deposition technique known in the art, such as, for example, epitaxial growth, chemical vapor deposition (CVD), physical vapor deposition (PVD), or atomic layer deposition (ALD). The metal layer 111 may be formed on the thinned bottom surface of the substrate 102 and on the exposed bottom connecting line 104b. The metal layer 111 can be any metallic material known in the art, such as, for example, Ti—Cu alloy.

Figure 5:
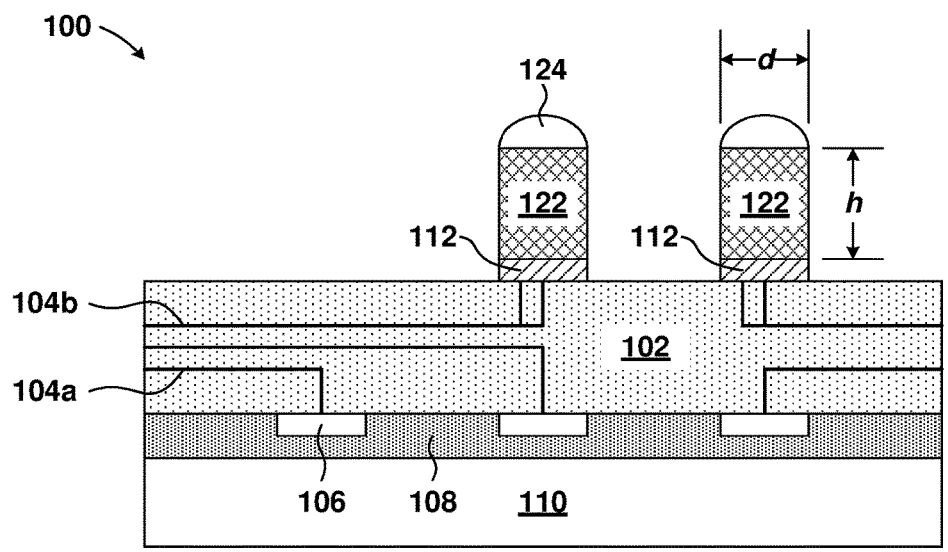
FIG. 5 is a cross sectional side view of the semiconductor structure and illustrates the formation of first metallic pillars on the semiconductor structure, according to an embodiment.

With reference to FIG. 5, a demonstrative illustration of the first structure 100 during an intermediate step of a method of fabricating micro-metallic pillars is provided, according to an embodiment. More specifically, a metallic pillar 122 may be formed on a second metallic attachment 112.

The second metallic attachment 112 may be formed by patterning the metal layer 111 using any patterning technique known in the art, such as, for example, a mask and etching process. The metallic pillar 122 can be formed on the second metallic attachment 112 using any deposition technique known in the art, such as, for example, epitaxial growth, chemical vapor deposition (CVD), physical vapor deposition (PVD), or atomic layer deposition (ALD). A mask used to form the second metallic attachment 112 may also be used to form the metallic pillar 122. The metallic pillar 122 can have a diameter (d) of about 25 µm and a height (h) of about 75 µm, however, other dimensions may be used. The pitch and location of the metallic pillar 122 may be adjustable to control a two-phase flow in a cooling system's micro-channels. A solder 124 may be formed on the metallic pillar 122 using any known solder deposition technique known in the art. The solder 124 may be used to bond the structure 100 to a second structure in subsequent steps described below.

Figure 6:
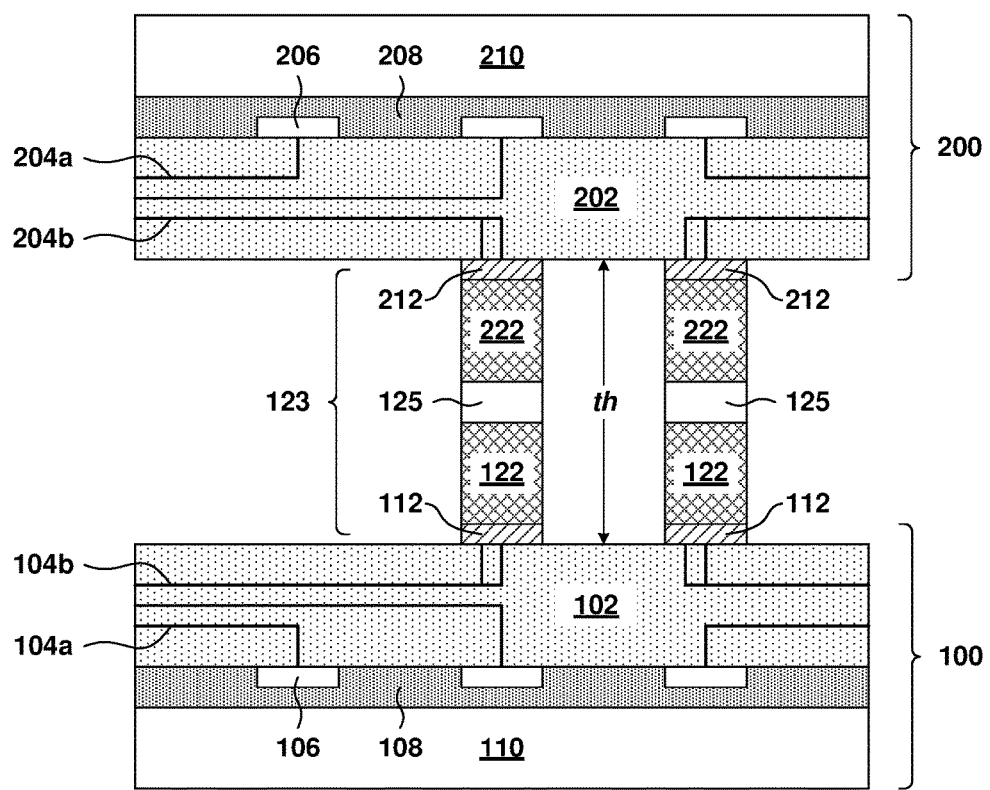
FIG. 6 is a cross sectional side view of an assembled semiconductor structure and illustrates the formation of a second structure bonded to the first structure, according to an embodiment.

With reference to FIG. 6, a demonstrative illustration of the first structure 100 during an intermediate step of a method of fabricating micro-metallic pillars is provided, according to an embodiment. More specifically, a second structure 200 may be bonded to the first structure 100.

The second structure 200 has a third metallic attachment 206 on a top surface of a second substrate 202 and a fourth metallic attachment 212 on a bottom surface of the second substrate 202. The third metallic attachment 202 and the fourth metallic attachment 212 are connected to a third connecting line 204a and a fourth connecting line 204b, respectively. It should be noted, the second structure 200 may have the same elements as the first structure 100, such that like reference numbers represent like elements. The second structure 200 may be aligned with the first structure using a second handler substrate. The second handler substrate can be bonded to the top surface of the second substrate 202 using a second adhesive layer 208 and a second handler layer 210 as is known in the art.

The assembling of the first structure 100 and the second structure 200 may be done using any bonding process known in the art, such as, for example, positioning the two structures to align metallic pillars and provide physical contact between the solder 124 on the metallic pillar 122 with solder on a second metallic pillar 222. The bonding process may include holding the structures in alignment while heating the solder, and continuing to hold the alignment while allowing the entire assembly to cool down and forming reflowed solder 125 between the metallic pillar 122 and the second metallic pillar 222. It should be noted, the metallic pillar 122, reflowed solder 125 and a second metallic pillar 222 may also be referred to as a metallic pillar 123 for exemplary purposes. The metallic pillar 123 may have a total height (th) of about 150 µm, but other heights may be used. In an embodiment, a fluid (e.g., coolant) may flow between structure 100 and second structure 200 through micro-channels to cool the structures and other chip assemblies. The fluid can pass between the metallic pillars 123 which can transfer heat from the semiconductor structures to the fluid. The fluid flow and pillar design are discussed further below. In an alternative embodiment, the depicted metallic pillars may also be formed from a non-metallic thermally conductive material. For example, pillars 122 and 222 may be constructed from a non-metallic but thermally conductive material, while a thermally conductive adhesive layer (not shown) may be used to bond these pillars instead of the reflowed solder 125.

Figure 7:
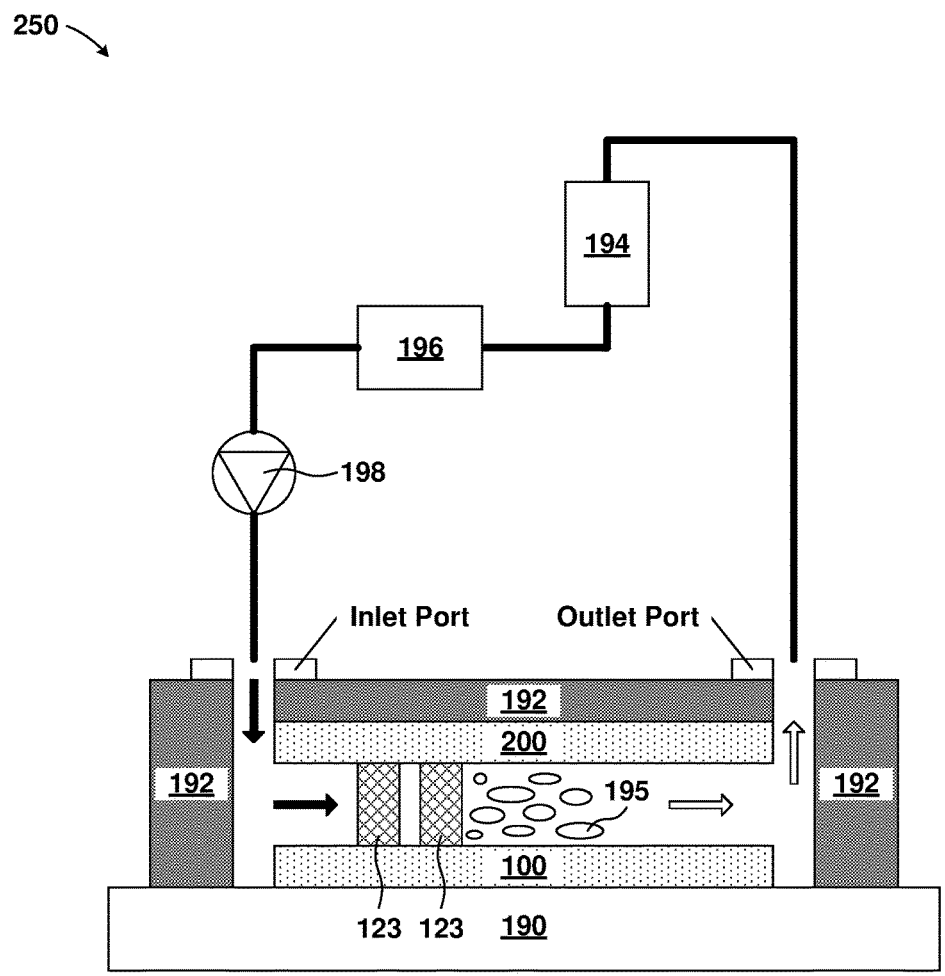
FIG. 7 is a cross sectional side view of the assembled semiconductor structure and illustrates a fluid path of flow through the assembled semiconductor structure, according to an embodiment.

With reference to FIG. 7, a demonstrative illustration of an assembled structure 250 is provided, according to an embodiment. More specifically, the assembled structure 250 illustrates a path of flow of the fluid as the semiconductor structures are cooled by transferring heat from the metallic pillars 123 (two-phase cooling process) to the fluid.

The fluid may have a path of flow passing through a reservoir 194, a filter 196, a pump 198, and the assembled structure 250. The assembled structure 250 can include the first and second structures 100, 200 within an enclosure 192 and on a base 190. The base 190 can be a laminate, such as, for example, an organic build-up substrate or a ceramic single or multi-chip module. The enclosure 192 can include one or more fluid inlet ports and outlet ports.

As the fluid enters the assembled structure 250 at the inlet port, the fluid passes between the metallic pillars 123 and the fluid channel before exiting the assembled structure 250 at the outlet port. As the fluid passes through the metallic pillars 123 (thermally cooling the metallic pillars 123 and the first and second structures 100, 200), the fluid may create bubbles 195.

It should be noted, this is an illustration of a parallel arrangement where the fluid enters from one side of the assembled structure 250 and exits on another side, however, a radial design may also be used where the fluid enters in a middle region of the assembled structure 250 and flows radial outward towards the sides of the assembled structure 250. The following drawings illustrate a few embodiments of a fluid path of flow as it passes through the metallic pillars 123 and a few alternative arrangements of fluid channels.

Figure 8:
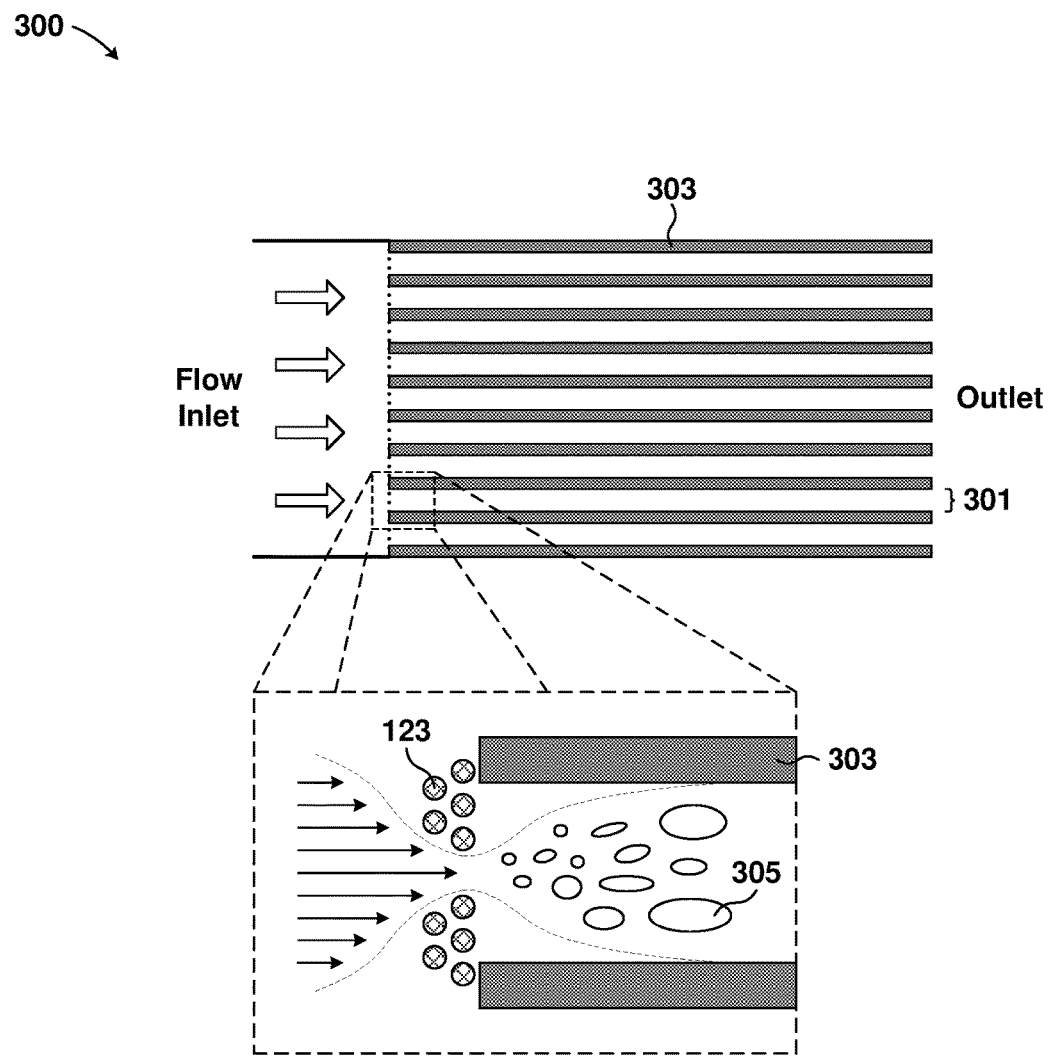
FIG. 8 is a cross sectional top view of fluid channels and illustrates the fluid path of flow through parallel fluid channels, according to an embodiment.
Figure 9:
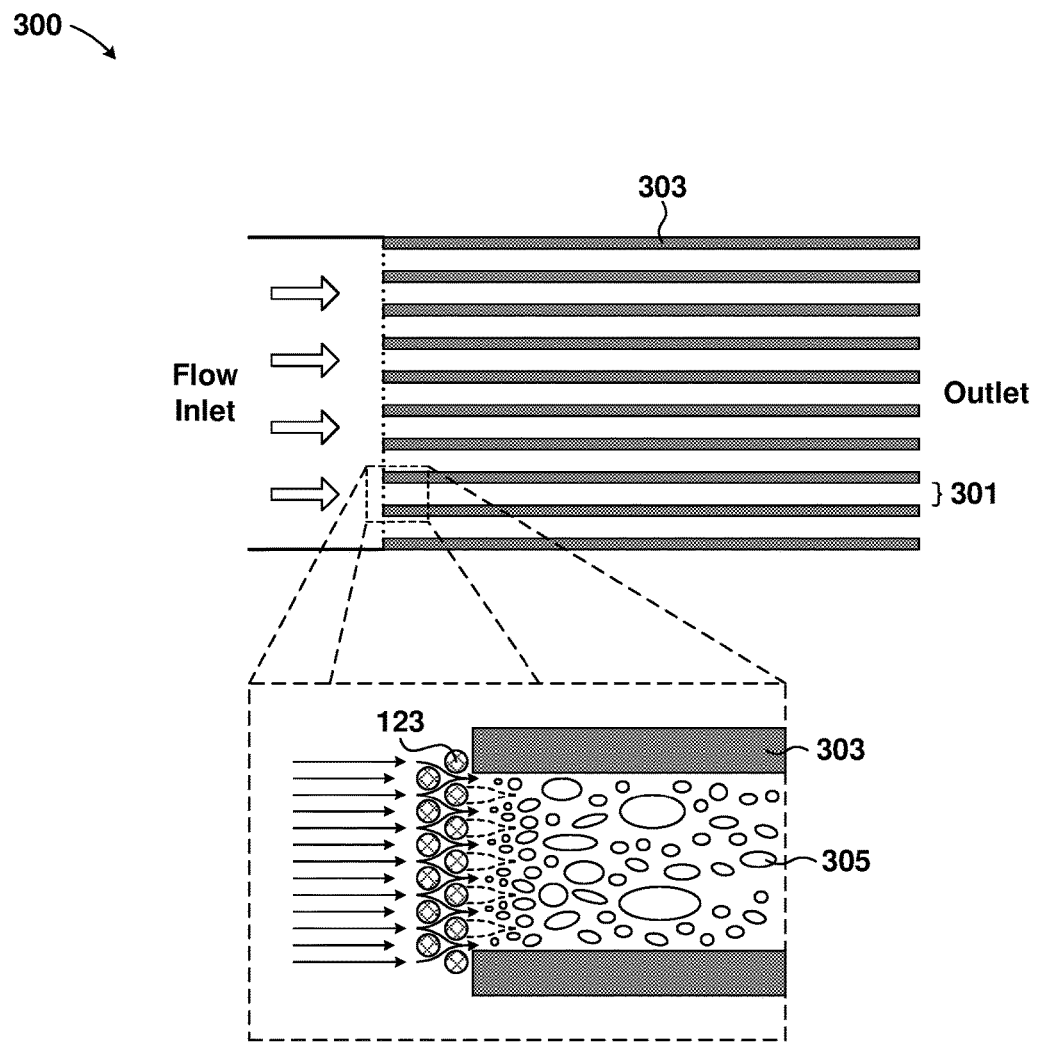
FIG. 9 is a cross sectional top view of fluid channels and illustrates the fluid path of flow through parallel fluid channels, according to an embodiment.
Figure 10:
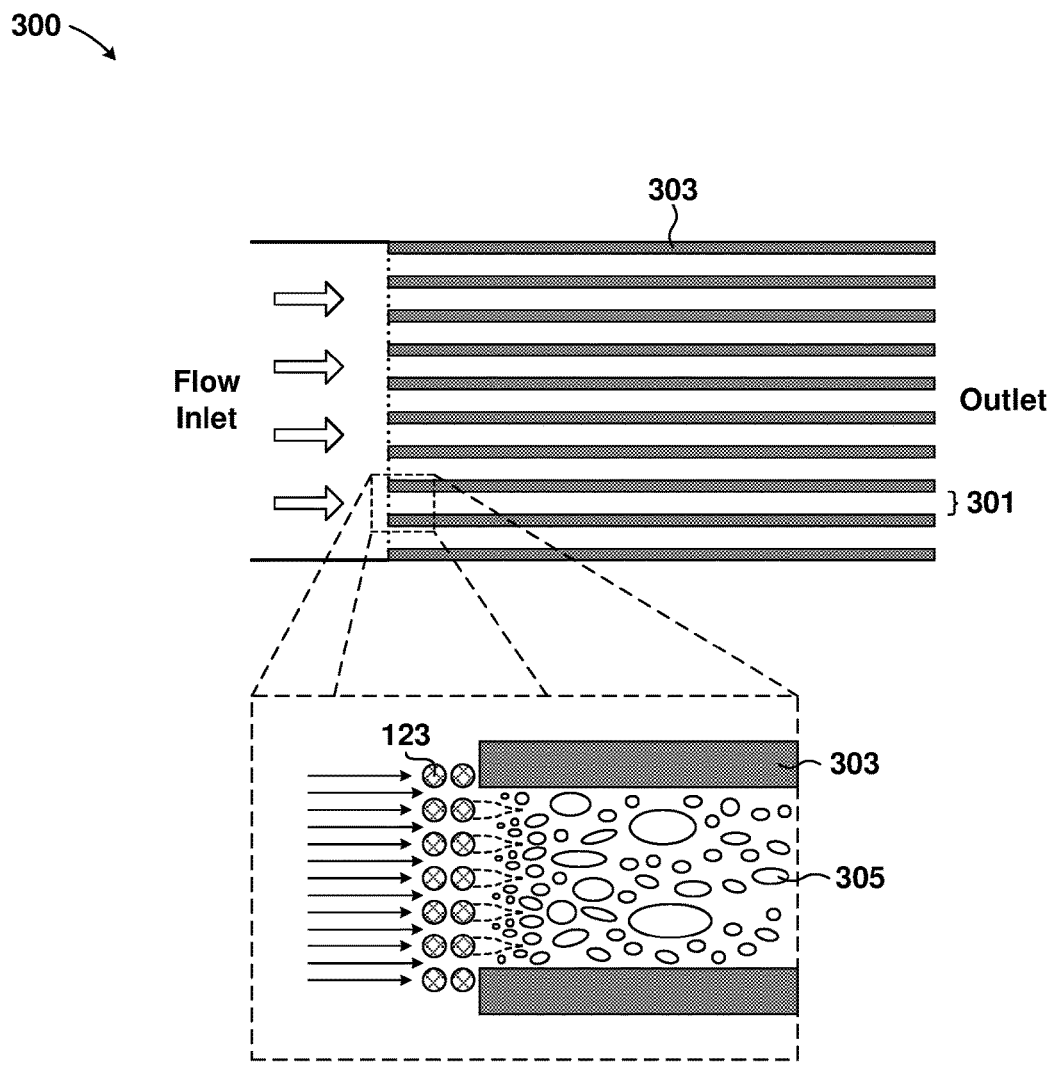
FIG. 10 is a cross sectional top view of fluid channels and illustrates the fluid path of flow through parallel fluid channels, according to an embodiment.

With reference to FIGS. 8-10, a demonstrative illustration of a fluid passing through channels 301 is provided, according to an embodiment. More specifically, bubble generation/nucleation is illustrated relative to alternative design embodiments of the metallic pillars 123. It should be noted, FIGS. 8-13 are top views of the assembled structure 250 illustrated in FIG. 7 taken along cross section line A-A.

Typically, rapid bubble growth in two-phase cooling system leads to severe pressure drop fluctuation and a reverse flow of liquid and vapor. Before the fluid flow enters the micro-channel, a vapor bubble is not flavored because the vapor bubble may be larger than the hydraulic diameter of the micro-channel inlet and may thus transiently or permanently prevent liquid flow from entering the micro-channel. Utilizing the metallic pillars, vapor bubble generation can be triggered and controlled inside micro-channels. Such flow instabilities are not favored by a two-phase cooling system. Moreover, vapor quality in each micro-channel could be different as a result of non-uniform heating profiles in ICs. Thus, inlet fluid flow rate should be controlled to match the heating profile and prevent a high-vapor-quality area from drying out. Depending on design requirements, the following embodiments are a few alternative arrangements for the metallic pillars 123.

A structure 300 may include a plurality of parallel channel walls 303. The fluid may flow from the inlet port, pass between the metallic pillars 123 and through the channels 301 during the two-phase process. As the fluid passes between the metallic pillars 123, bubbles 305 may form and may be controlled by the arrangement of the metallic pillars 123.

FIG. 8 depicts an embodiment of a two-phase flow design having parallel channels 301 with a non-uniform arrangement of the metallic pillars 123 and having an opening at the middle of the arrangement (i.e., an orifice). The pitch at the orifice may be larger than 50 µm and smaller than a width of channel inlet, however, other dimensions may be used. The inlet flow rate may be passively controlled by the pitch at the orifice. Each channel 301 can share the same pressure head, where a larger pitch may allow for a relatively high flow rate for relatively high heat loading, for example, core or hot spot area, while a small pitch may generate relatively low flow rate for relatively low heat loading, for example, peripheral interface circuits and connectors. The orifice stops large and rapid bubble from reversely flowing into the inlet area. After passing the Vena Contracta area, the fluid velocity can reach maximum values. The increase in velocity comes at the expense of fluid pressure, which leads to low local pressure in the Vena Contracta area. If the local pressure is less than the vapor pressure of the liquid coolant, vapor bubbles may be generated inside the channels 301. This feature helps the system in reducing boiling wall superheat, which is a case when the channel wall 303 surface temperatures are higher than the liquid saturated temperature but phase change from liquid to vapor may not be initiated.

FIG. 9 depicts an embodiment of a two-phase flow design having parallel channels 301 with a staggered arrangement for the metallic pillars 123. The pitch may be larger than 25 µm and smaller than the width of channel inlet. The inlet flow rate may be passively controlled by the permeability of pillar array. The permeability is controlled by pitch and the number of rows of metallic pillars 123. In the illustrated embodiment, two rows of metallic pillars 123 are used, however, any number of rows may be used. Since this arrangement results small and multiple Vena Contracta areas, it may lead to small bubble generations inside the channels 301. This feature may generate more uniform flow velocity field and enhance two-phase flow stability.

FIG. 10 depicts an embodiment of a two-phase flow design having parallel channels 301 with an inline arrangement of the metallic pillars 123. This embodiment is similar to the embodiment illustrated in FIG. 9, but can allow for a higher flow rate using the same pitch and the same number of rows.

Figure 11:
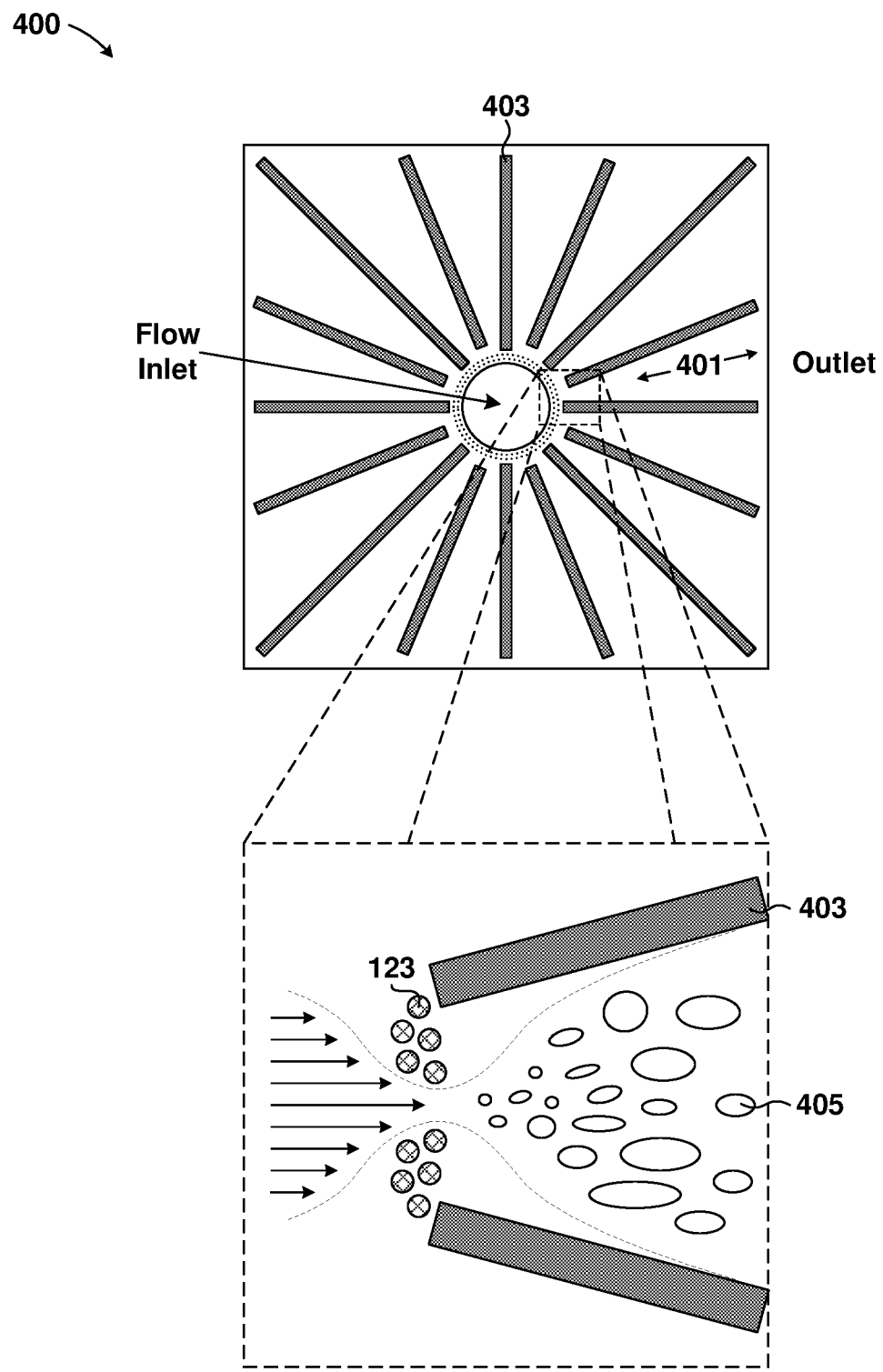
FIG. 11 is a cross sectional top view of fluid channels and illustrates the fluid path of flow through radial fluid channels, according to an embodiment.
Figure 12:
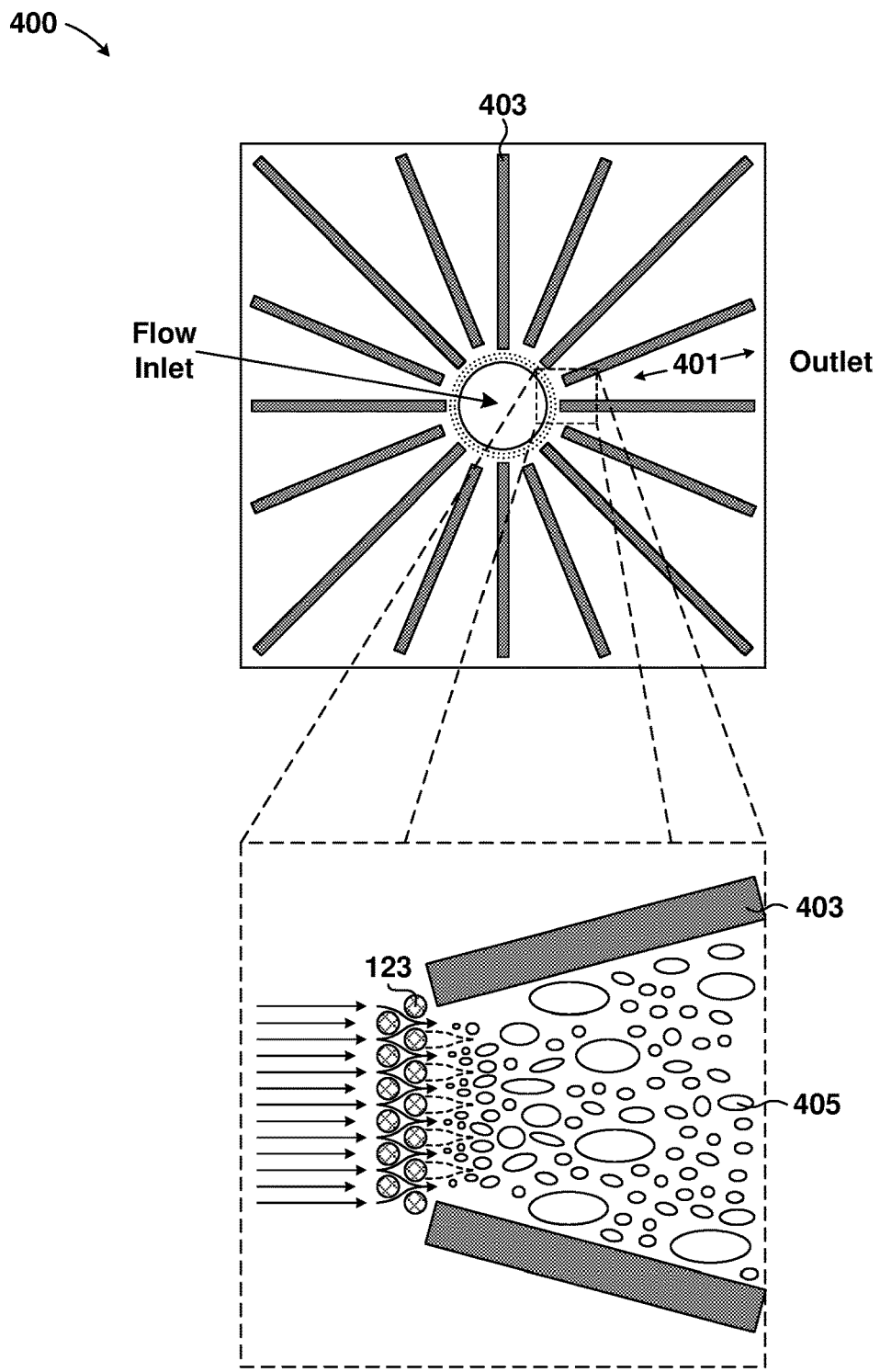
FIG. 12 is a cross sectional top view of fluid channels and illustrates the fluid path of flow through radial fluid channels, according to an embodiment.
Figure 13:
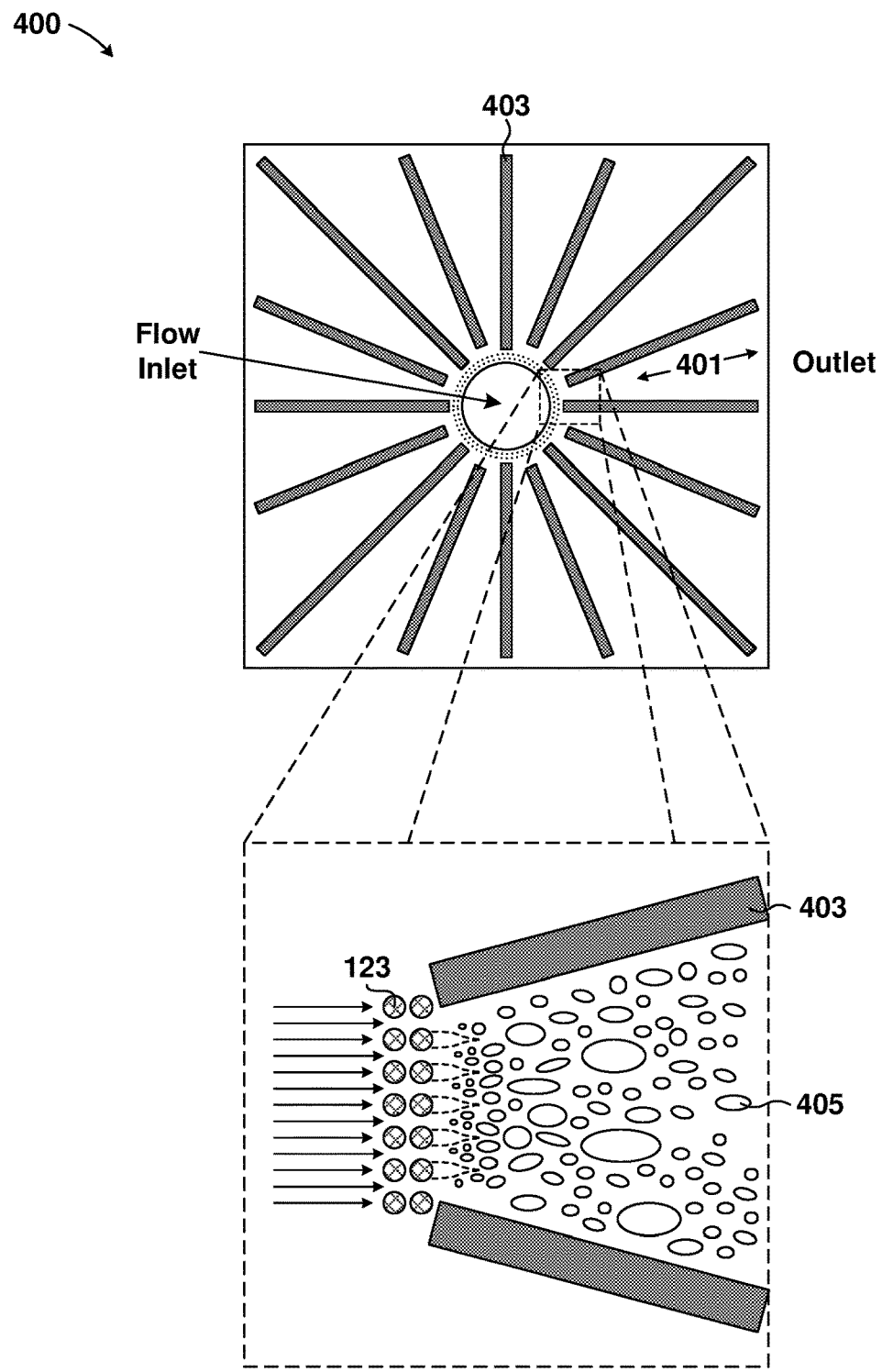
FIG. 13 is a cross sectional top view of fluid channels and illustrates the fluid path of flow through radial fluid channels, according to an embodiment.

With reference to FIGS. 11-13, a demonstrative illustration of a radial structure 400 is provided having a fluid passing through channels 401, according to an embodiment. More specifically, bubbles 405 are illustrated during bubble generation/nucleation relative to alternative design embodiments of channel walls 403 and the metallic pillars 123.

FIG. 11 depicts an embodiment of a two-phase flow design having radial channels 401 with a non-uniform arrangement of the metallic pillars 123. The design and arrangement of the metallic pillars 123 may be similar to the embodiment illustrated in FIG. 8 (i.e., including an opening at the middle of the metallic pillars 123 arrangement).

FIG. 12 depicts an embodiment of a two-phase flow design having radial channels 401 with a staggered arrangement for the metallic pillars 123. The design and arrangement of the metallic pillars 123 may be similar to the embodiment illustrated in FIG. 9 (i.e., this embodiment may result in small and multiple Vena Contracta areas, it may lead to small bubble generations inside the radial channels 401).

FIG. 13 depicts an embodiment of a two-phase flow design having radial channels 401 with an inline arrangement of the metallic pillars 123. The design and arrangement of the metallic pillars 123 may be similar to the embodiment illustrated in FIG. 10 (i.e., this embodiment can allow for a higher flow rate using the same pitch and the same number of rows).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A two-phase method for cooling semiconductor structures in a chip stack comprising:
    forming metallic pillars between a first semiconductor structure and a second semiconductor structure, the metallic pillars located in a fluid channel, the fluid channel separating the first semiconductor structure and the second semiconductor structure, and a coolant flowing into the fluid channel from an inlet port and exiting from and outlet port, wherein the metallic pillars transfer heat from the first semiconductor structure and the second semiconductor structure to the coolant, provide an electrical connection between the first semiconductor structure and the second semiconductor structure, and provide structural support for the first semiconductor structure and the second semiconductor structure,
    wherein the coolant enters the fluid channel through the second semiconductor structure and exits the fluid channel at an outer perimeter side of the first semiconductor structure and the second semiconductor structure, and wherein the fluid channels are configured in a radial arrangement.

2. The method of claim 1, wherein the coolant enters the fluid channel from a first outer perimeter side of the first semiconductor structure and the second semiconductor structure and exits the fluid channel at a second outer perimeter side of the first semiconductor structure and the second semiconductor structure.

3. The method of claim 1, wherein the metallic pillars are arranged in a staggered arrangement between adjacent fluid channel walls.

4. The method of claim 1, wherein the metallic pillars are arranged in an inline arrangement between adjacent fluid channel walls.

* * * * *